(12) United States Patent
Chong et al.

(10) Patent No.: US 8,836,101 B2
(45) Date of Patent: Sep. 16, 2014

(54) MULTI-CHIP SEMICONDUCTOR PACKAGES AND ASSEMBLY THEREOF

(75) Inventors: Chooi Mei Chong, Perak (MY); Teck Sim Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 703 days.

(21) Appl. No.: 12/889,738

(22) Filed: Sep. 24, 2010

(65) Prior Publication Data

US 2012/0074546 A1 Mar. 29, 2012

(51) Int. Cl.
*H01L 23/02* (2006.01)
*H01L 25/16* (2006.01)
*H01L 23/495* (2006.01)
*H01L 25/065* (2006.01)
*H01L 21/56* (2006.01)
*H01L 23/31* (2006.01)
*H01L 23/00* (2006.01)

(52) U.S. Cl.
CPC .............. *H01L 21/568* (2013.01); *H01L 25/16* (2013.01); *H01L 24/40* (2013.01); *H01L 2224/73263* (2013.01); *H01L 2224/83815* (2013.01); *H01L 2224/45124* (2013.01); *H01L 2224/45147* (2013.01); *H01L 2224/48247* (2013.01); *H01L 23/49575* (2013.01); *H01L 2924/01047* (2013.01); *H01L 2924/01033* (2013.01); *H01L 2924/01012* (2013.01); *H01L 2224/83805* (2013.01); *H01L 2924/01013* (2013.01); *H01L 2924/01006* (2013.01); *H01L 24/45* (2013.01); *H01L 2224/97* (2013.01); *H01L 2224/48137* (2013.01); *H01L 2924/0103* (2013.01); *H01L 24/49* (2013.01); *H01L 2224/73215* (2013.01); *H01L 2224/48145* (2013.01); *H01L 25/0652* (2013.01); *H01L 2224/40247* (2013.01); *H01L 2224/32245* (2013.01); *H01L 2924/01005* (2013.01); *H01L 2224/92247* (2013.01); *H01L 2924/01322* (2013.01); *H01L 24/83* (2013.01); *H01L 2224/32145* (2013.01); *H01L 2224/29139* (2013.01); *H01L 24/32* (2013.01); *H01L 2224/83855* (2013.01); *H01L 24/97* (2013.01); *H01L 21/565* (2013.01); *H01L 2224/45144* (2013.01); *H01L 2224/48091* (2013.01); *H01L 2224/85095* (2013.01); *H01L 2924/01078* (2013.01); *H01L 23/49503* (2013.01); *H01L 24/92* (2013.01); *H01L 2224/49171* (2013.01); *H01L 2924/01082* (2013.01); *H01L 2224/92246* (2013.01); *H01L 2224/2919* (2013.01); *H01L 2224/85469* (2013.01); *H01L 2224/83862* (2013.01); *H01L 2924/014* (2013.01); *H01L 2224/85411* (2013.01); *H01L 2924/01079* (2013.01); *H01L 2224/73265* (2013.01); *H01L 24/29* (2013.01); *H01L 2224/85439* (2013.01); *H01L 2224/291* (2013.01); *H01L 23/49537* (2013.01); *H01L 2224/04042* (2013.01); *H01L 2924/01029* (2013.01); *H01L 2224/85444* (2013.01); *H01L 2924/13091* (2013.01); *H01L 2924/01051* (2013.01); *H01L 23/4952* (2013.01); *H01L 24/73* (2013.01); *H01L 21/561* (2013.01); *H01L 2224/73221* (2013.01); *H01L 23/3107* (2013.01); *H01L 24/48* (2013.01)
USPC .................................. 257/686; 257/E25.013

(58) Field of Classification Search
USPC ........... 257/E25.018, 777, E25.013, 686, 773
See application file for complete search history.

(56) References Cited

U.S. PATENT DOCUMENTS

| | | | |
|---|---|---|---|
| 5,286,426 A | | 2/1994 | Rano, Jr. et al. |
| 5,994,166 A | * | 11/1999 | Akram et al. .................. 257/686 |
| 6,400,004 B1 | | 6/2002 | Fan et al. |
| 6,621,155 B1 | * | 9/2003 | Perino et al. ................... 257/777 |
| 7,087,461 B2 | | 8/2006 | Park et al. |
| 7,777,348 B2 | * | 8/2010 | Kodama et al. ............... 257/777 |
| 8,436,458 B2 | * | 5/2013 | Haba et al. .................... 257/777 |
| 2006/0087013 A1 | * | 4/2006 | Hsieh ............................ 257/678 |
| 2009/0128968 A1 | * | 5/2009 | Lu et al. ........................... 361/56 |

| | | | |
|---|---|---|---|
| 2009/0189297 | A1 | 7/2009 | Sugawara et al. |
| 2009/0278243 | A1* | 11/2009 | Chuang et al. ............... 257/676 |
| 2010/0006997 | A1 | 1/2010 | Shen et al. |
| 2010/0009500 | A1 | 1/2010 | Abbott |
| 2010/0015761 | A1 | 1/2010 | Haga et al. |
| 2010/0149770 | A1* | 6/2010 | Park et al. .................... 257/778 |

OTHER PUBLICATIONS

Freescale Semiconductor, Inc., "Quad Flat Pack No-Lead (QFN) Micro Dual Flat Pack No-Lead (uDFN)," AN1902, Rev. 4.0, Sep. 2008, 34 pages.

\* cited by examiner

*Primary Examiner* — Stephen W Smoot
*Assistant Examiner* — Sun M Kim

(74) *Attorney, Agent, or Firm* — Slater & Matsil, L.L.P.

(57) ABSTRACT

Semiconductor packages and method of fabricating them are described. In one embodiment, the semiconductor package includes a substrate having a first and a second die attach pad. A first die is disposed over the first die attach pad. A second die is disposed over the second die attach pad. A third die is disposed between the first and the second die. The third die having a first, a second, and a third portion such that the first portion is disposed above a portion of the first die, the second portion is disposed above a portion of the second die, and the third portion is disposed above an area between the first die and the second die.

16 Claims, 12 Drawing Sheets

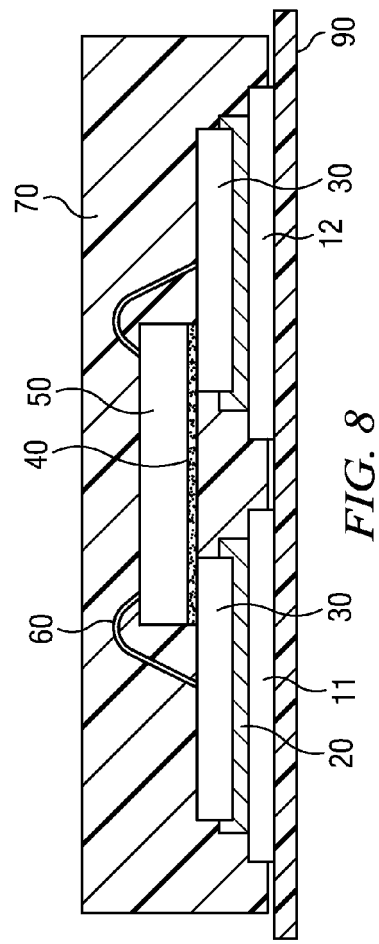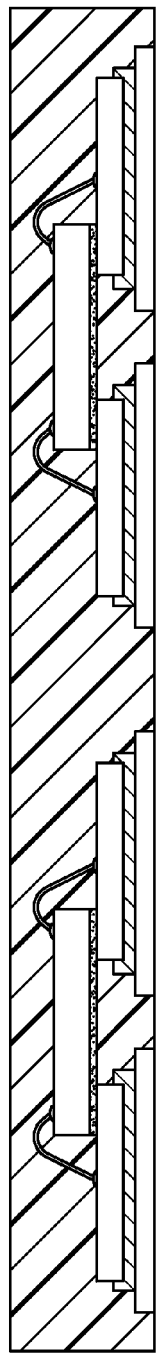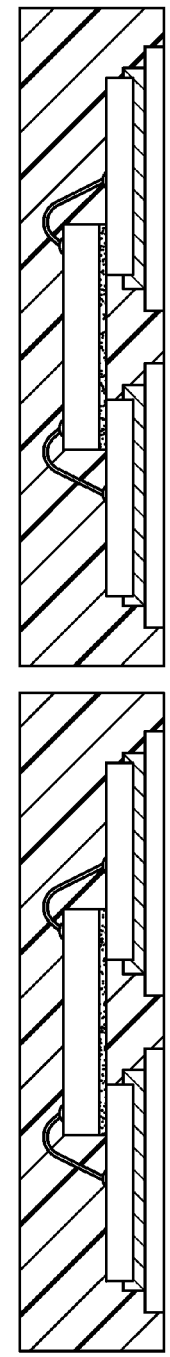

MULTI-CHIP SEMICONDUCTOR PACKAGES AND ASSEMBLY THEREOF

TECHNICAL FIELD

The present invention relates generally to semiconductor packages, and more particularly to multi-chip semiconductor packages and assembly thereof.

BACKGROUND

Integrated circuit chips are conventionally enclosed in a package that provides protection from environmental conditions and enables electrical interconnection between the semiconductor chip and another electrical component, such as a printed circuit board or a motherboard. A semiconductor package may include a supporting leadframe having leads, a semiconductor chip electrically coupled to the leadframe, and an encapsulating material molded over a surface of the leadframe and the chip.

Leadframe packages are used in packaging semiconductor chips because of their low manufacturing cost and high reliability. However, the cost advantage of leadframe decreases with an increase in the complexity of the packaging. For example, packages requiring integration of multiple chips require the use of more expensive leadframes due to the increase in package size and process complexity.

SUMMARY OF THE INVENTION

These and other problems are generally solved or circumvented, and technical advantages are generally achieved, by illustrative embodiments of the present invention.

In accordance with an embodiment of the present invention, a semiconductor package includes a substrate comprising a first and a second die attach pad. A first die is disposed over the first die attach pad. A second die is disposed over the second die attach pad. A third die having at least a first, a second, and a third portion is disposed between the first and the second die such that the first portion is disposed above a portion of the first die, the second portion is disposed above a portion of the second die, and the third portion is disposed above an area between the first die and the second die.

In accordance with an embodiment of the invention, a method of formation of a semiconductor package includes attaching a first die over a first die attach pad of a substrate. A second die is attached over a second die attach pad of the substrate. The method further includes attaching a third die to the first and the second die. In one or more embodiments, a first portion of the third die is attached to a first portion of the first die, a second portion of the third die is attached to a first portion of the second die, and a third portion of the third die is attached to a first area between the first die and the second die.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, is a semiconductor package in accordance with an embodiment of the invention, wherein FIG. 1a illustrates a top view, and wherein FIG. 1b illustrates a cross sectional view of the semiconductor package;

FIG. 3 illustrates a portion of the leadframe substrate of FIG. 2 in accordance with embodiments of the invention, wherein

FIG. 4, which includes FIGS. 4a and 4b, illustrates the semiconductor package in a stage of manufacturing in accordance with an embodiment of the invention, wherein FIG. 4a illustrates a cross-sectional view and FIG. 4b illustrates a top view;

FIG. 6, which includes FIGS. 6a and 6b, illustrates the semiconductor package in a subsequent stage of manufacturing in accordance with an embodiment of the invention, wherein FIG. 6a illustrates a cross-sectional view and FIG. 6b illustrates a top view;

FIG. 7, which includes FIGS. 7a and 7b, illustrates the semiconductor package in a subsequent stage of manufacturing in accordance with an embodiment of the invention, wherein FIG. 7a illustrates a cross-sectional view and FIG. 7b illustrates a top view;

FIG. 8 illustrates a cross-sectional view of the semiconductor package in a next stage of manufacturing after mold encapsulation in accordance with an embodiment of the invention;

FIG. 9, which includes FIGS. 9a and 9b, illustrates the dicing process after mold encapsulation in accordance with an embodiment of the invention, wherein FIG. 9a illustrates the semiconductor package before dicing, while FIG. 9b illustrates the semiconductor package after dicing;

FIG. 11, which includes

FIG. 13, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Integrating multiple chips into a single semiconductor package requires the use of large die pads for supporting all the chips. Alternatively, multiple die pads are used such that each die pad supports a particular chip. However, all these increase the package size thereby requiring the use of expensive packaging techniques. For example, larger packages require the use of a more expensive cavity molding process; whereas smaller packages can be fabricated using the less expensive mold array process (MAP) also called map molding process. In various embodiments, the present invention reduces the package size of multi-chip semiconductor packages by using a novel integration scheme. This allows the use of the less expensive map molding process.

In various embodiments, the present invention reduces the package size by partially stacking chips thereby reducing the package size. In one or more embodiments, the package size is reduced by eliminating a centrally located die pad of the leadframe.

A structural embodiment of a semiconductor package will be described using FIG. 1. A method of fabricating the semiconductor package in accordance with embodiments of the invention will be described using FIG. 2-9. Further structural embodiments will be described using FIGS. 10-13.

Figure 1A:
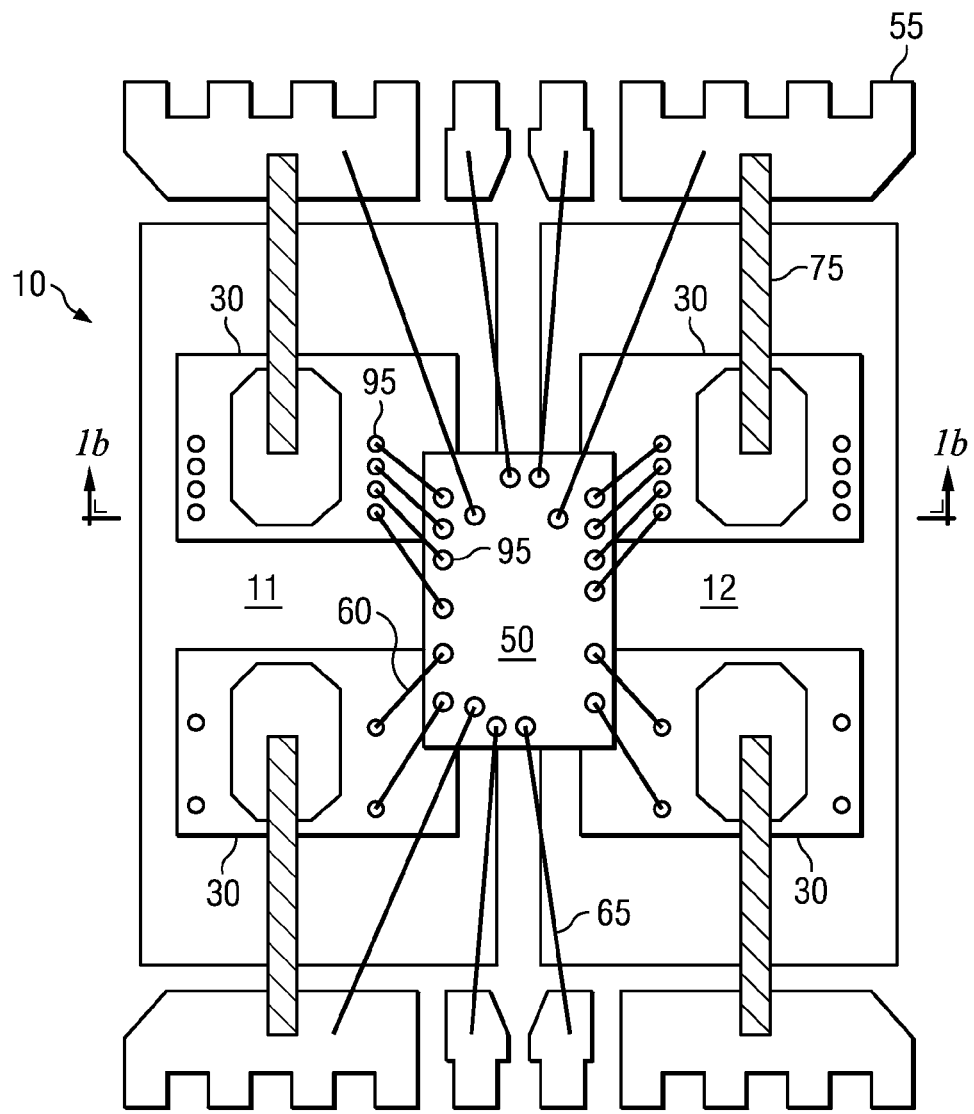

A semiconductor package is illustrated in accordance with an embodiment of the invention using FIG. 1. Referring to FIG. 1a, a substrate 10 comprises first and second die attach pads 11 and 12. In various embodiments, the substrate 10 comprises printed circuit board, ceramic printed circuit board, or a bump chip carrier (BCC) metal carrier.

In various embodiments, the substrate 10 comprises a leadframe having a dual flat non-lead (DFN) (as illustrated in FIG. 1a), quad flat no-lead (QFN) and small outline no-lead (SON) frame structure. A leadframe is a conductive support or frame structure for securely attaching an integrated circuit (IC) chip or die of a semiconductor device. Depending on the type of package being formed, the thickness of the leadframe varies, for example, between about 0.1 mm to about 2 mm. In various embodiments, the leadframe comprises a thickness between about 0.05 mm to about 0.4 mm.

In various embodiments, the substrate 10 comprises conductive metals such as copper, copper alloys, or iron-nickel alloys (such as "alloy 42", invar etc.), aluminum, silicon alloys, magnesium, and zinc including alloys such as brass. The substrate 10 materials are selected based on the desired thermal, mechanical, and electrical properties. The substrate 10 may be formed by etching and/or stamping processes.

The substrate 10 includes electrical pads on a bottom surface for providing electrical connection to the package. The substrate 10 may also include thermal pads for efficiently drawing out heat from the active devices. Thus, the support 10 not only provides a stable support base for securely attaching the first dies 30, but also advantageously transfers heat from the first dies 30 to a heat spreader (not shown) and/or to an optional heat sink (not shown).

A plurality of contacts 55 are disposed around the first and second die attach pads 11 and 12. In one embodiment, the semiconductor package comprises at least four first dies 30 disposed on the first and the second die attach pads 11 and 12. In one embodiment, each die attach pad has two first dies 30 disposed over it. The first dies 30 are placed symmetrically over the first and the second die attach pads 11 and 12 in one embodiment.

Figure 1B:
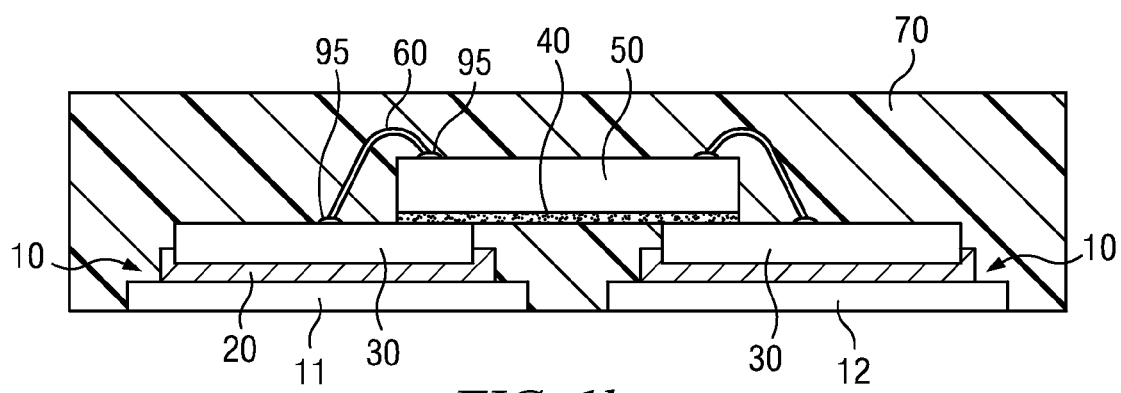

As illustrated in FIG. 1b, the first dies 30 are coupled to the substrate 10 through solder 20. In various embodiments, the solder 20 comprises a silver paste. In various embodiments, the solder 20 comprises any suitable electrical conductive material for coupling the substrate 10 to the first dies 30.

A second die 50 is disposed over the substrate 10 as shown in FIGS. 1a and 1b. The second die 50, in one embodiment, comprises a driver circuit that drives the first dies 30. Hence, in various embodiments, the second die 50 is placed symmetrically between the first dies 30. In particular, as illustrated in FIGS. 1a and 1b, the second die 50 is disposed over a portion of the first dies 30.

The first and the second dies 30 and 50 comprise analog, logic, or power devices in various embodiments. In one or more embodiments, the first dies 30 comprise power devices such as power MOSFETs, and the second die 50 comprises circuitry for operating the power MOSFET.

In one or more embodiments, the first and the second dies 30 and 50 comprise devices for automotive applications. In one embodiment, the first dies 30 comprise high current motor power chips, and the second die 50 comprises driver chips driving the power chips. The first and the second dies 30 and 50 control the operation of motors in various automotive and non-automotive applications in various embodiments.

Further, in various embodiments, each of the the first dies 30 may not all be identical. In various embodiments, the first dies 30 may be different types of dies including dies of different sizes and/or functionality.

In various embodiments, the second die 50 may be electrically coupled to each of the first dies 30 and to the substrate 10. A plurality of bond pads 95 is disposed on each of the first and the second dies 30 and 50. Each bond pad of the plurality of bond pads 95 is coupled to active circuitry within the first and the second dies 30 and 50.

A first plurality of bonding wires 60 couples the second die 50 to each of the first dies 30. A second plurality of bonding wires 65 couples the second die 50 with the plurality of contacts 55 on the substrate 10. Each of the first dies 30 is coupled to the plurality of contacts 55 on the substrate 10 through contact leads 75. In alternate embodiments, the contact leads 75 may only help to mechanically support the first dies 30 while all electrical connection is made directly within the substrate 10.

In various embodiments, the first and the second bonding wires 60 and 65 are fabricated from gold, but may also be fabricated from copper, aluminum, and alloys thereof. In various embodiments, the first and the second bonding wires 60 and 65 conduct power and/or I/O signals between the first and the second dies 30 and 50 or between the second die 50 and the plurality of contacts 55 on the substrate 10. Similarly, the contact leads 75 may conduct power and/or I/O signals between the first dies 30 and the substrate 10.

Advantageously, by placing the second die 50 over the first dies 30, the length of the first plurality of bonding wires 60 is lowered reducing the resistance of the electrical connections as well as decreasing unwanted interference. As a consequence, the electrical performance of the semiconductor package is improved due to the resulting reduction in parasitic devices including resistances, capacitances, and inductances.

In various embodiments, the thermal performance of the semiconductor package is also improved. In one or more embodiments, the second die 50 includes a temperature sensor for monitoring the temperature of the semiconductor package. The primary source for the increase in temperature is because of the operation of the first dies 30. The lowering of the length of the first plurality of bonding wires 60 also reduces the thermal resistance between the second die 50 and the first dies 30. Therefore, the temperature sensor on the second die 50 senses the temperature of the first dies 30 more effectively thereby improving the thermal performance of the semiconductor package.

An encapsulant 70 (FIG. 1*b*) is disposed over the substrate 10 covering the first and the second dies 30 and 50. In various embodiments, the encapsulant 70 protects the first and the second dies 30 and 50, and the substrate 10. The encapsulant 70 comprises a molding material. In various embodiments, the encapsulant 70 comprises a polymer. In one embodiment, the encapsulant 70 comprises an epoxy-based molding compound.

In various embodiments, the placement of the second die 50 over the first dies 30 reduces the area (foot print) of the substrate 10. Advantageously embodiments of the invention reduce the cost of fabricating the semiconductor package due to the reduction in the area of the substrate 10.

A method of manufacturing the semiconductor package in accordance with an embodiment of the invention will be described using FIGS. 2-9.

Figure 2:
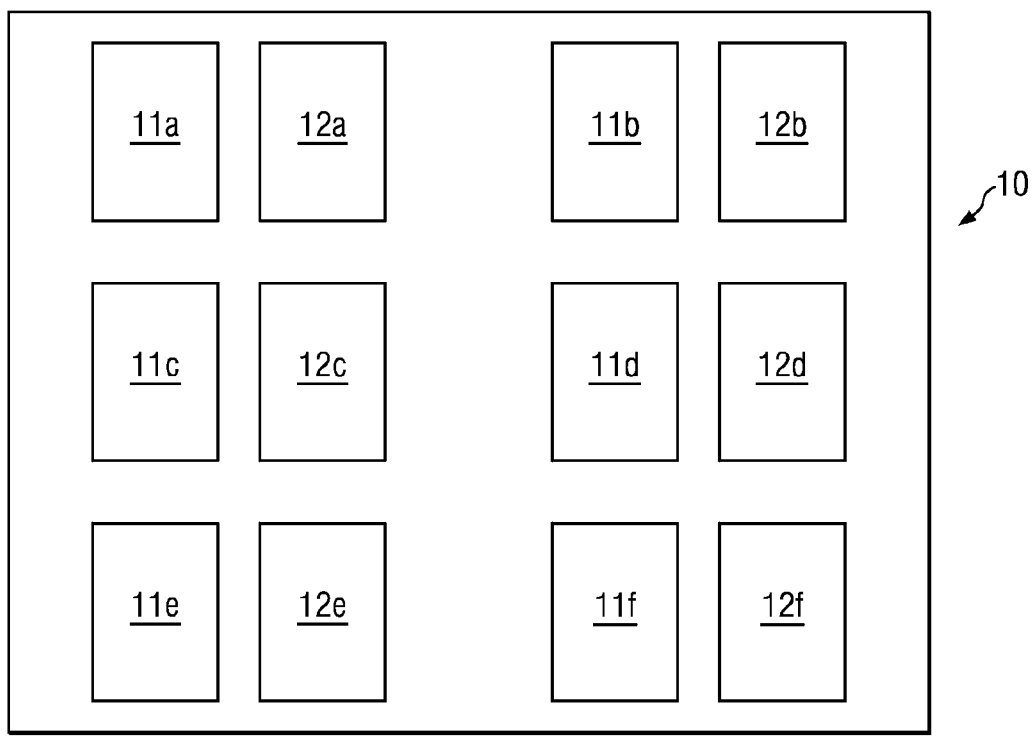
FIG. 2 illustrates a leadframe substrate used in accordance with embodiments of the invention.
Figure 3A:
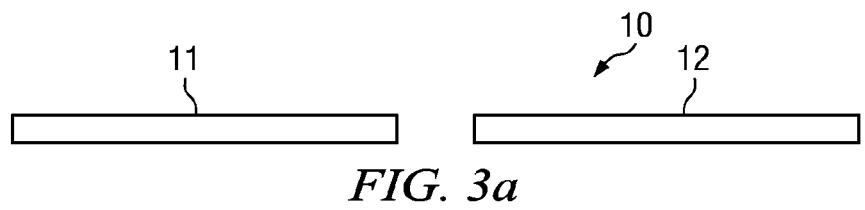
FIG. 3a illustrates a cross-sectional view and FIG. 3b illustrates a top view.
Figure 3B:
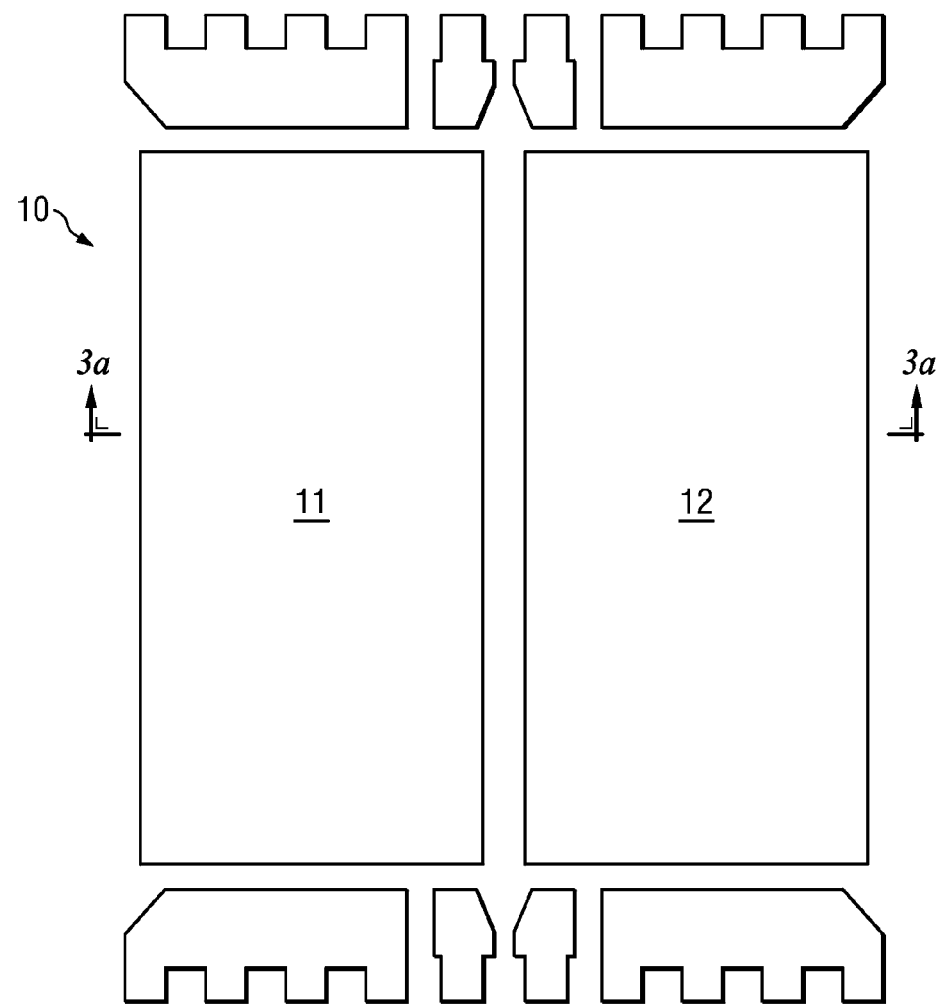

FIG. 2 illustrate a substrate 10 including a plurality of die attach pads 11*a*/12*a*-11*f*/12*f*. FIG. 3, which includes FIGS. 3*a* and 3*b*, illustrate a closer view of the substrate 10 shown in FIG. 2. The substrate 10 is manufactured using conventional techniques including etching and/or stamping. As shown in FIG. 3, the substrate 10 comprises die attach pads 11/12 for securing chips. A plurality of contacts 55 are disposed adjacent the die attach pads 11/12 and are electrically not coupled to the die attach pads 11/12. The plurality of contacts 55 are coupled to external contacts (not shown) on the back side of the substrate 10.

Figure 4A:
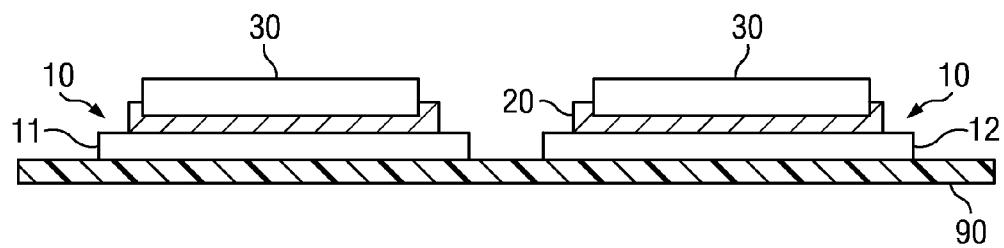
Figure 4B:
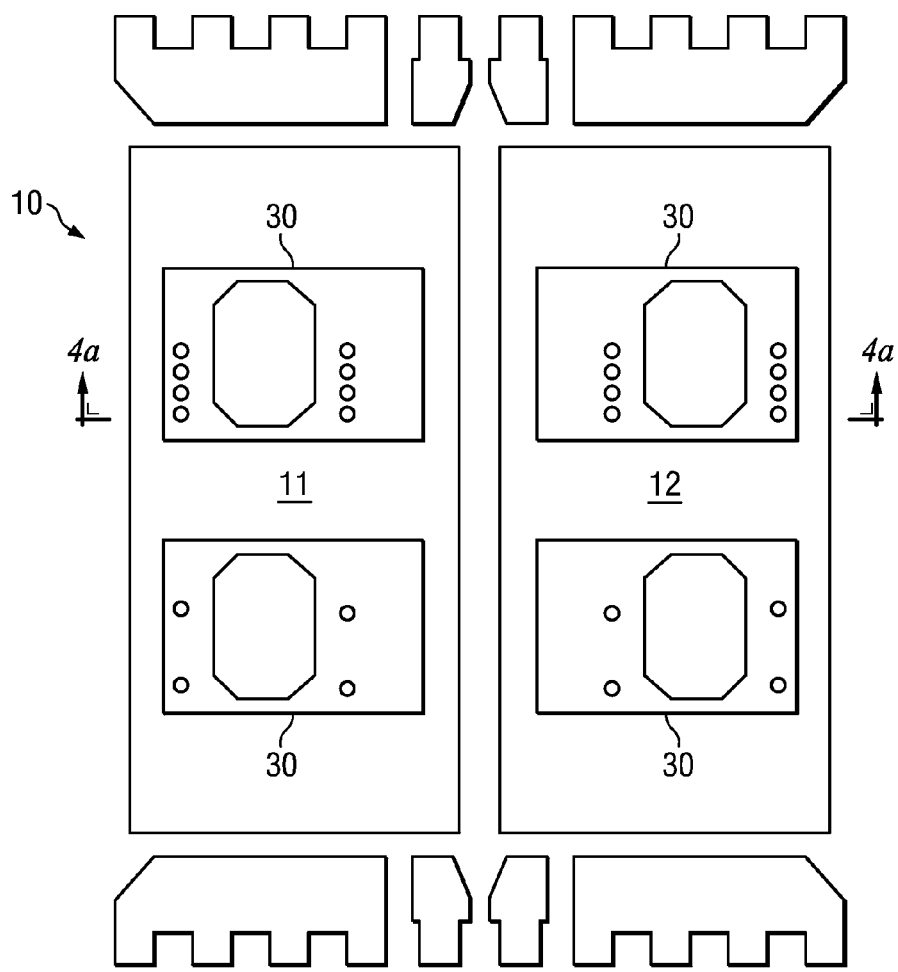

FIG. 4, which includes FIGS. 4*a* and 4*b*, illustrates the semiconductor package after mounting the first dies 30 over the substrate 10. A carrier tape 90 may be attached to a bottom surface of the substrate 10 to support the substrate 10 and to facilitate processing. Solder paste is applied to a top surface of the first dies 30. In various embodiments, the solder paste comprises a silver paste. Referring to FIG. 4, the first dies 30 are placed over the die attach pads 11/12 (e.g. FIG. 4*b*, which illustrates a top view). The package is heated to reflow the solder paste forming solder 20 (FIG. 4*a*, which illustrates a cross-sectional view). The solder 20 forms a first eutectic alloy with an exposed metal layer on the top surface of the first dies 30 and a second eutectic with an exposed metal layer on the top surface of the substrate 10, in one or more embodiments. Consequently, only the exposed metal layers on the first dies 30 and the substrate 10 are electrically coupled to the solder 20.

Figure 5:
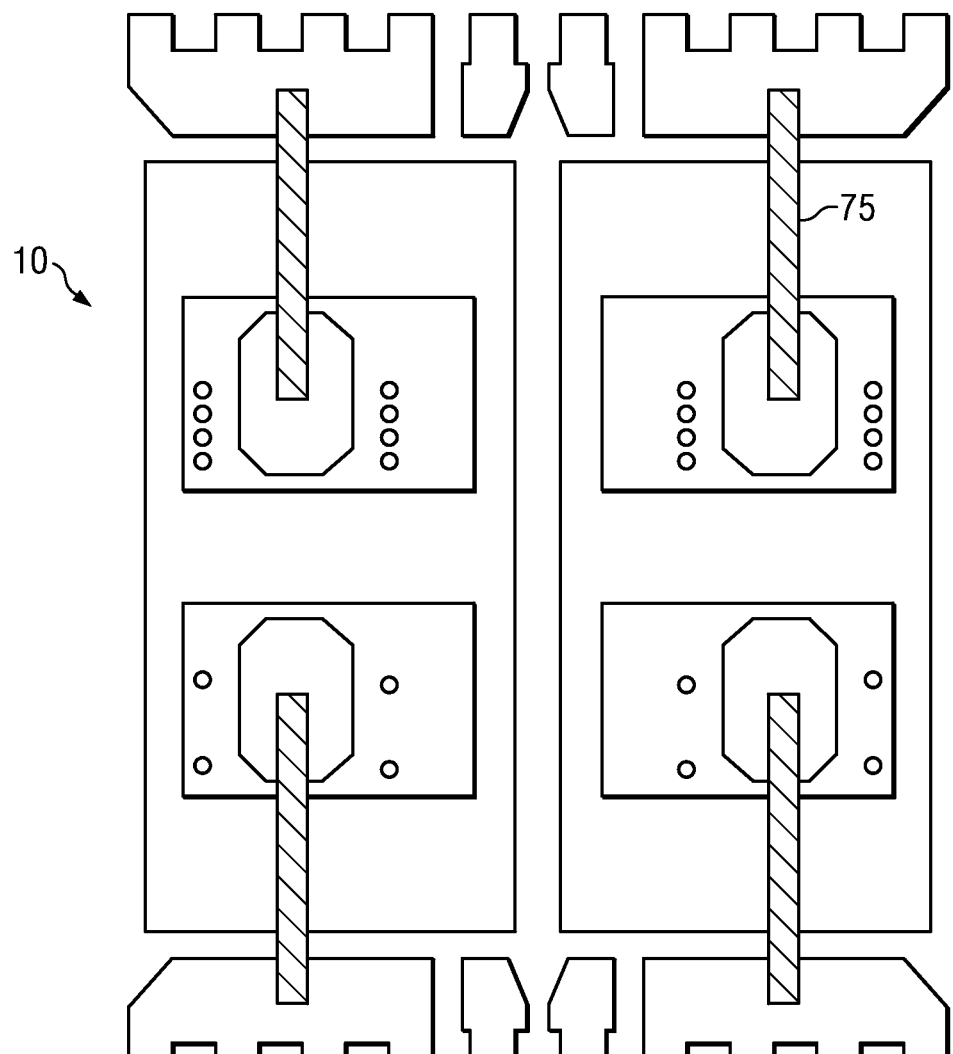
FIG. 5 illustrates a top view of the semiconductor package in a next stage of manufacturing in accordance with an embodiment of the invention.

Next, as illustrated in FIG. 5, each of the first dies 30 is coupled to the plurality of contacts 55 on the substrate 10 through contact leads 75. The first dies 30 are thereby coupled to external contacts on the back surface of the substrate 10.

Figure 6A:
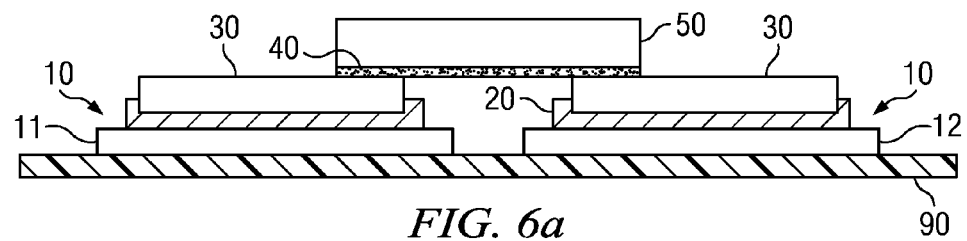
Figure 6B:
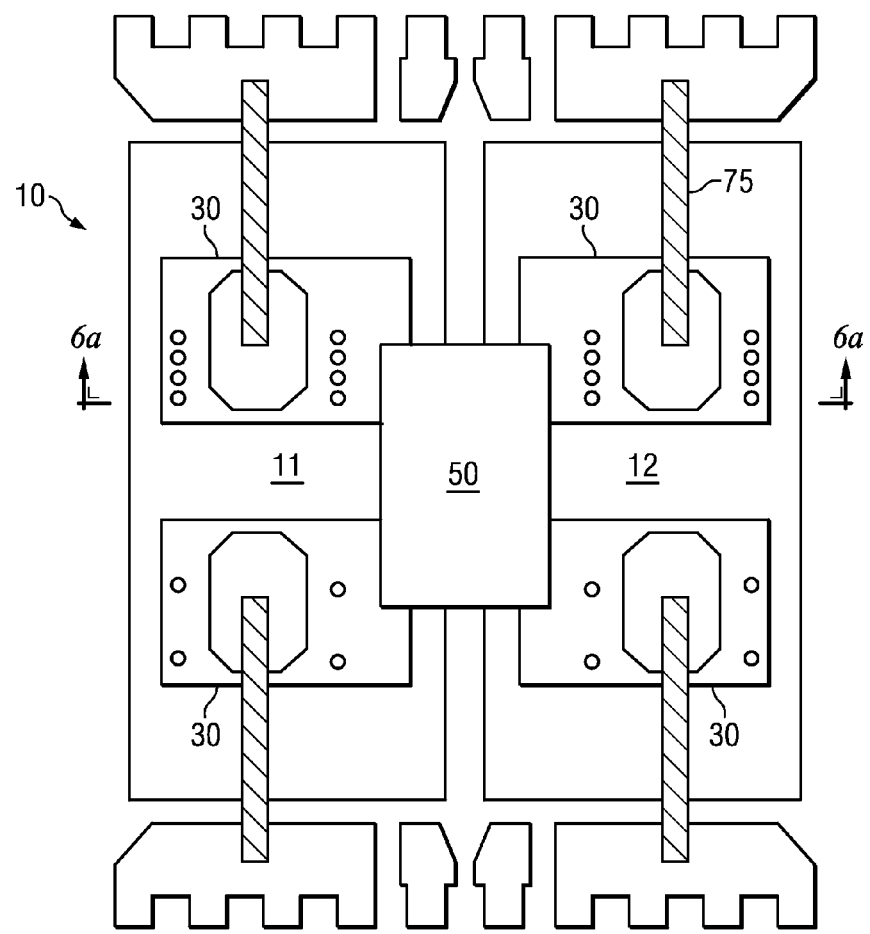

Referring to FIG. 6, a second die 50 is bonded to the first dies 30. As illustrated in the top view of FIG. 6*b*, the second die 50 is placed symmetrically between and over the first dies 30. In various embodiments, only a part of the second die 50 overlaps with the first dies 30. The remaining part of the second die 50 is disposed over a gap between the first dies 30 as illustrated in the cross-sectional view of FIG. 6*a*.

The second die 50 is attached to the first dies 30 using an adhesive film 40 (FIGS. 6*a* and 6*b*). In various embodiments, the adhesive film 40 is an electrical insulator, for example, comprising a polymer material. The back surface of the second die 50 is pre-laminated with an adhesive film 40. In one embodiment, the back surface of the second die is opposite to a top surface having the active devices. In various embodiments, the adhesive film 40 is applied to the back surface of the second die 50. The semiconductor package is heated to cure the adhesive film 40 forming physical bonds between the first and the second dies 30 and 50.

Figure 7A:
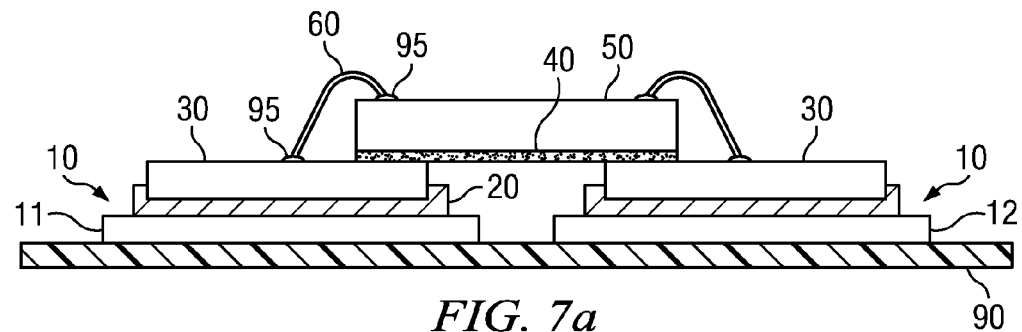
Figure 7B:
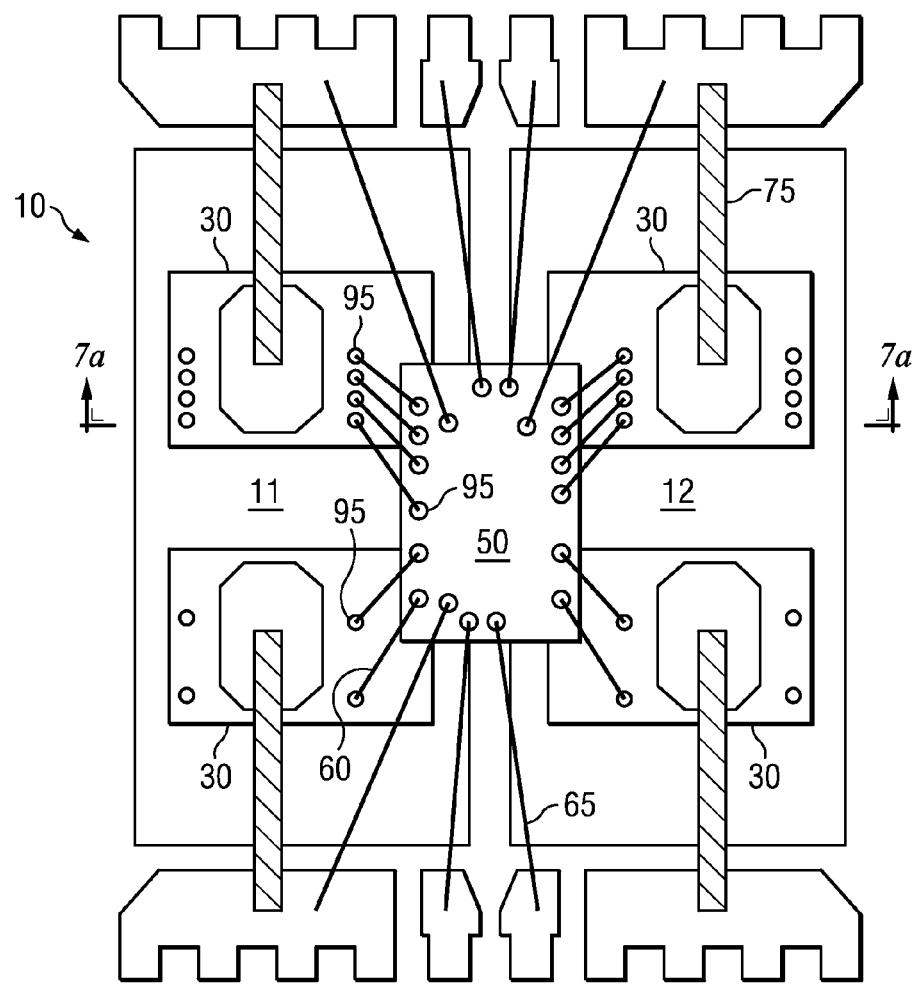

FIG. 7, which includes FIGS. 7*a* and 7*b*, illustrates the semiconductor package after forming wire bonding, wherein FIG. 7*a* is a cross-sectional view and FIG. 7*b* is a top view.

Referring to FIG. 7*a*, a first plurality of bonding wires 60 couples the second die 50 to each of the first dies 30. The first plurality of bonding wires 60 couple to bond pads 95 on the first and the second dies 30 and 50 thereby electrically coupling the first dies 30 with the second die 50. In one embodiment, the first plurality of bonding wires 60 is attached to the bond pads 95 on the second die 50. Subsequently, the opposite unattached end (free end) of the first plurality of bonding wires 60 is attached to the bond pads 95 on the first dies 30.

As illustrated in FIG. 7*b*, a second plurality of bonding wires 65 is formed to electrically couple the bond pads 95 on the second die 50 with the plurality of contacts 55 on the substrate 10. In one embodiment, the second plurality of bonding wires 65 is attached to the bond pads 95 on the second die 50. Subsequently, the opposite unattached end (free end) of the second plurality of bonding wires 65 is attached to the plurality of contacts 55 on the substrate 10.

In various embodiments, the first and the second bonding wires 60 and 65 are fabricated from gold, but may also be fabricated from copper, aluminum, and alloys thereof. The wire bonding is performed at about 150° C. to about 250° C.

Referring to FIG. 8, an encapsulant 70 is formed for protecting the semiconductor package. The substrate 10, the first and the second dies 30 and 50 are covered with a molding compound. In one embodiment, the molding compound comprises a liquid epoxy that can fill in the gap under the second die 50 and between the first dies 30. The liquid epoxy may be injected into the gap in one or more embodiments. This is followed by a curing process. The mold curing process is performed between about 200° C. to about 400° C.

FIG. 9, which includes FIGS. 9*a* and 9*b*, illustrate the sawing process forming semiconductor packages in accordance with embodiments of the invention.

FIG. 9*a* illustrates the semiconductor package in the same stage of processing as illustrate in FIG. 8. However, FIG. 9*a* illustrates two semiconductor packages whereas FIG. 8 illustrated a more magnified view showing a portion of the substrate 10 having only two die attach pads.

In embodiments having a carrier tape 90, the carrier tape 90 is removed exposing the bottom surface of the semiconductor package.

A deflashing process is next performed. During deflashing any excess mold material sticking out of the edges of the package or on other unwanted parts of the package such as leads or heat sinks etc. is removed. This excess mold material, also called flash, if not removed can result in severe electrical or even thermal performance degradation. In various embodiments, the deflashing process may be performed using a chemical or a mechanical process. Examples of the deflashing process include use of water jet and dipping in chemical solutions. In some embodiments, a laser deflashing process may be used.

The bottom surface of the semiconductor package is plated with tin forming the external contacts. The deflashing process, described above, may be modified to prevent any whisker growth during the plating step. In various embodiments, the outer leads of the semiconductor package are plated with tin. In various embodiments, the plating material comprises Sn, Sn—Ag, Sn—Sb, and combinations thereof. In alternate embodiments, the plating material may comprise Pt, Ag, Au, and combinations thereof.

As shown next in FIG. 9b, the semiconductor packages are separated or singulated. In one embodiment, the individual packages are singulated by sawing. Alternatively, in some embodiments, a chemical process may be used to singulate the packages into separate units.

Figure 10:
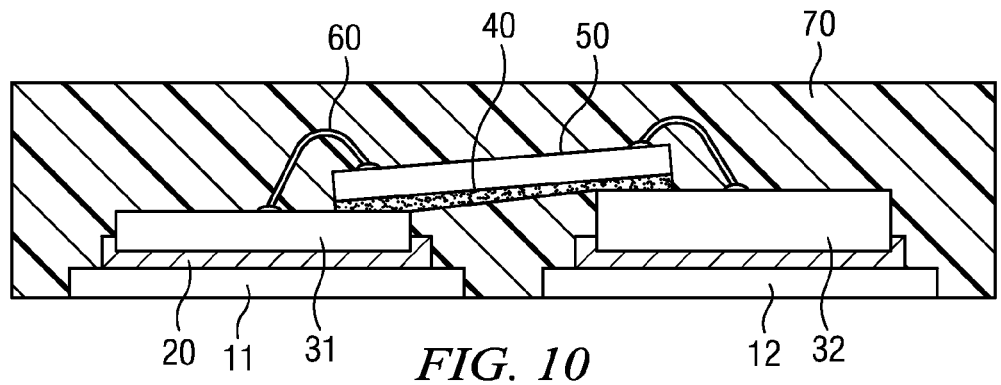
FIG. 10 illustrates an embodiment of the invention in which chips of different thickness are used.

FIG. 10 illustrates an embodiment of the semiconductor package wherein chips of different thicknesses are used.

Although the prior method of formation was described for a semiconductor package having chips of about the same thickness, embodiments of the invention also include packages having chips of different thickness. For example, as illustrated in FIG. 10, the first chip 31 has a different thickness from a second chip 32. Hence, although both the first and the second chip 31 and 32 are placed above die attach pads 11/12 having a co-planar surface, the top surfaces of the first and the second chip 31 and 32 are not co-planar. Despite these differences, embodiments of the invention do not have any problem attaching the second die 50 to the first and the second chips 31 and 32. This is because the adhesive film 40 during curing will form a substantially flat top surface and/or adhere even if the surface is not flat. Further, the adhesive film 40 is flexible and can undergo deformation.

Figure 11A:
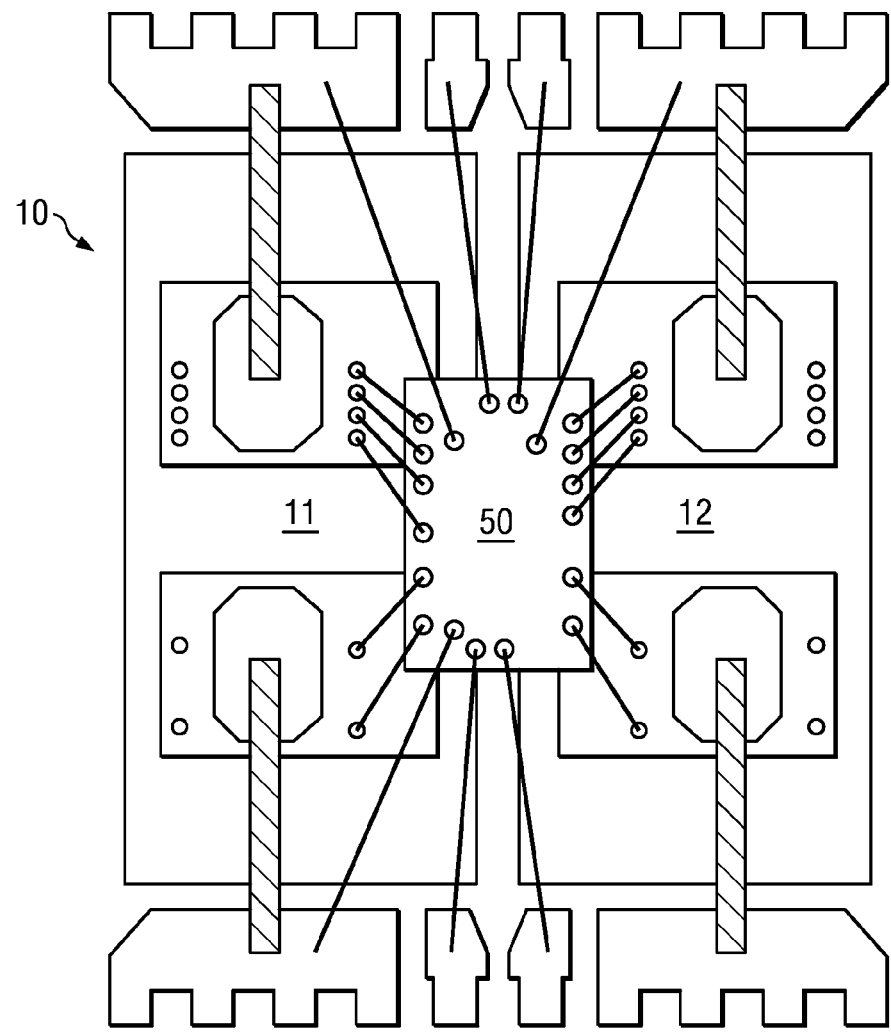
FIGS. 11a-11c, illustrate embodiments have different number of first dies disposed over each die attach pads.
Figure 11B:
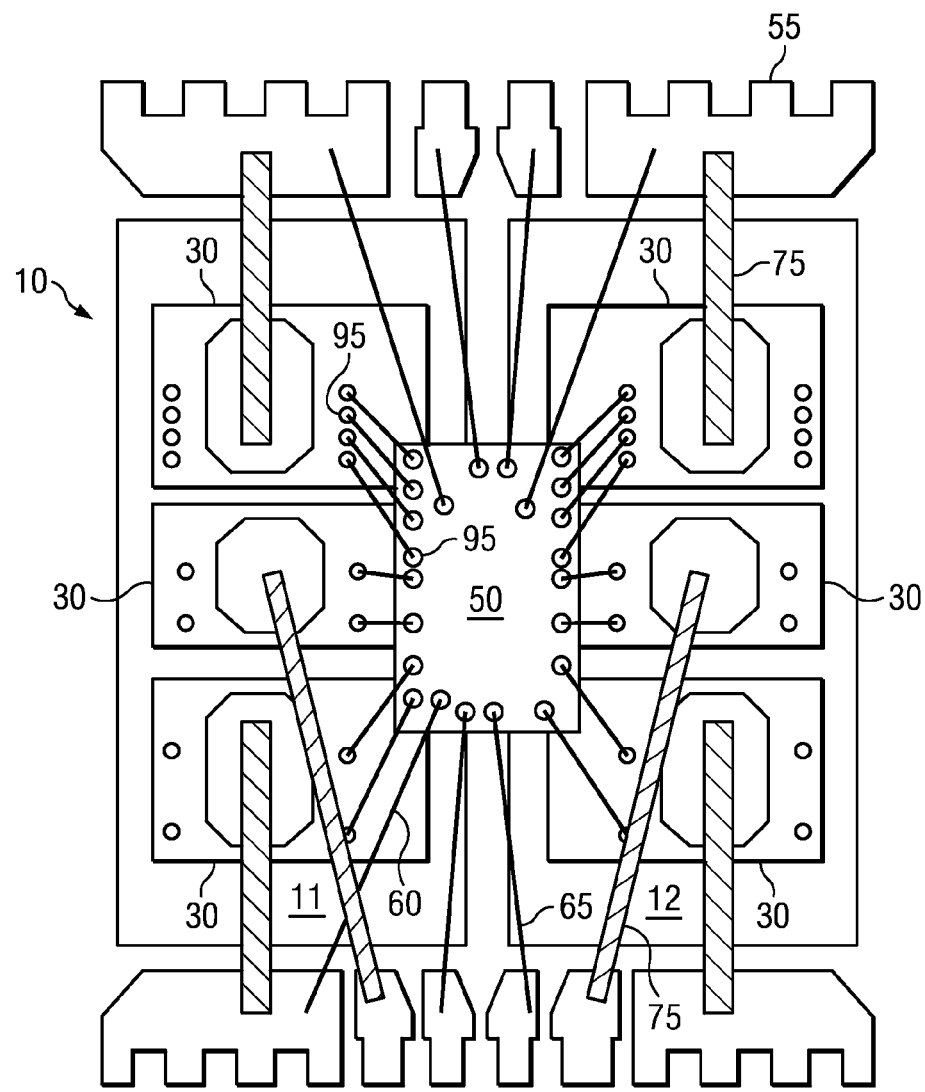
Figure 11C:
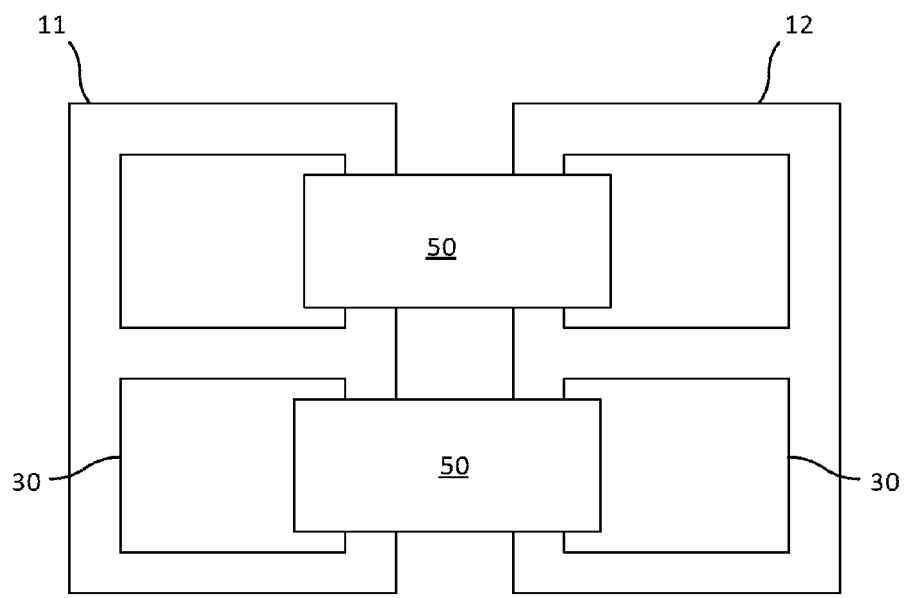

FIG. 11, which includes FIGS. 11a-11c, illustrate embodiments have different number of first dies 30 disposed over each die attach pads. FIG. 11a illustrates an embodiment showing two first dies 30 and a second die 50 disposed between and over the two first dies 30. FIG. 11b illustrates an embodiment showing six first dies 30 and a second die 50 disposed over the six first dies 30. FIG. 11c illustrates an embodiment showing four first dies 30 and two second dies 50 disposed over the four first dies 30.

Although in this embodiment, only two or six dies are shown, in various embodiments, other number of dies may be used. For example, in different embodiments, eight or ten first dies 30 may be used with a single second die 50 partially covering them as described in other embodiments.

Further, the substrate is shown to have only two rows of contacts on the two opposite edges. However, in some embodiments, the substrate 10 may have contacts on all four edges.

In alternate embodiments, multiple second dies 50 may be used although in embodiments described so far only one second die 50 was shown. In one embodiment, two second dies 50 are disposed over four first dies 30 such that each pair of first die 30 has a second die 50 disposed over it (FIG. 11c). Alternatively, in one embodiment, two second dies 50 are disposed over eight first dies 30 such that each set of four first die 30 has a second die 50 disposed over it.

Figure 12:
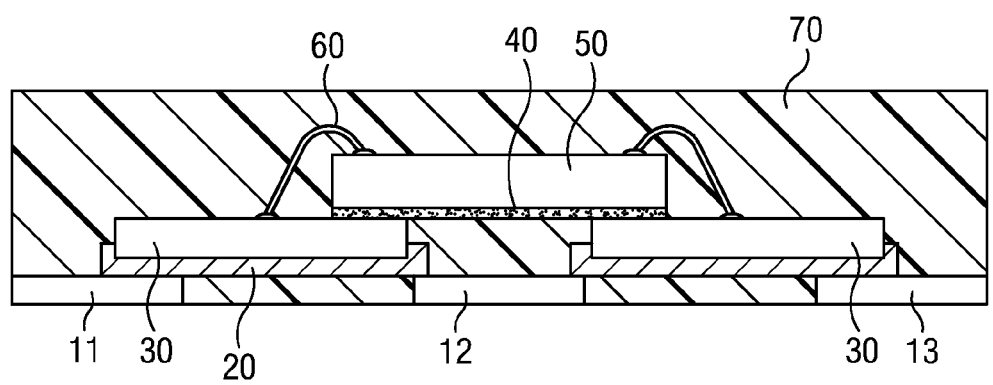
FIG. 12 illustrates a semiconductor package in accordance with an embodiment of the invention, wherein the area of the foot print of the substrate is reduced although the number of die attach pads is not reduced.

FIG. 12 illustrates a semiconductor package in accordance with an embodiment of the invention, wherein the area of the foot print of the substrate is reduced although the number of die attach pads is not reduced. FIG. 12 illustrates an embodiment of the invention showing two first dies 30 disposed over three die attach pads 11/12/13. However, a second die 50 is disposed over the first dies 30 and above inner die attach pad 12. Because of the improved packing, the total footprint of the semiconductor package is reduced although three die attach pads are used. A plurality of bond wires may be used to contact the first dies with the substrate 10 in one or more embodiments.

Figure 13A:
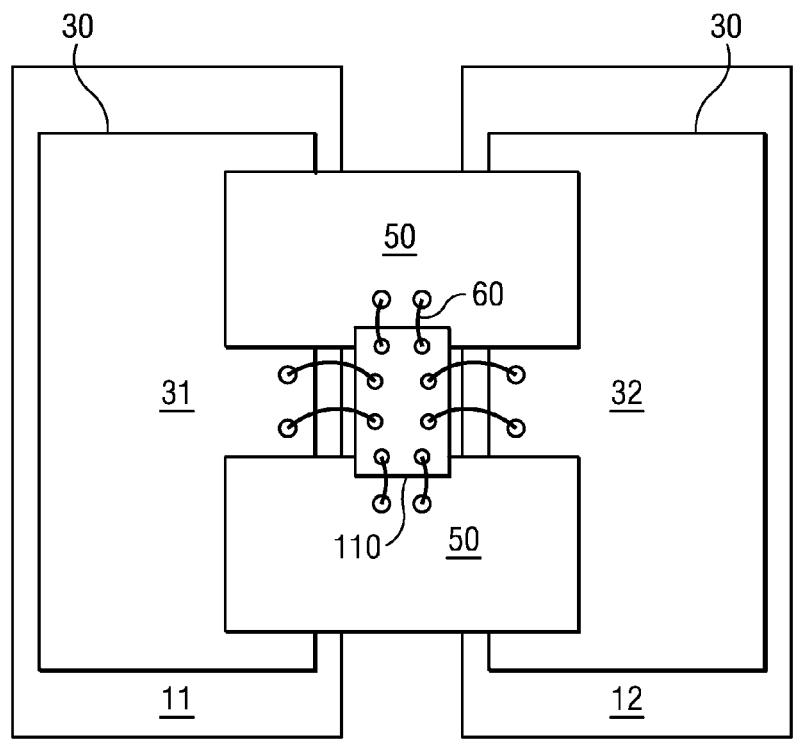
FIGS. 13a and 13b, illustrates an embodiment of the semiconductor package, wherein chips of different sizes are efficiently packaged.
Figure 13B:
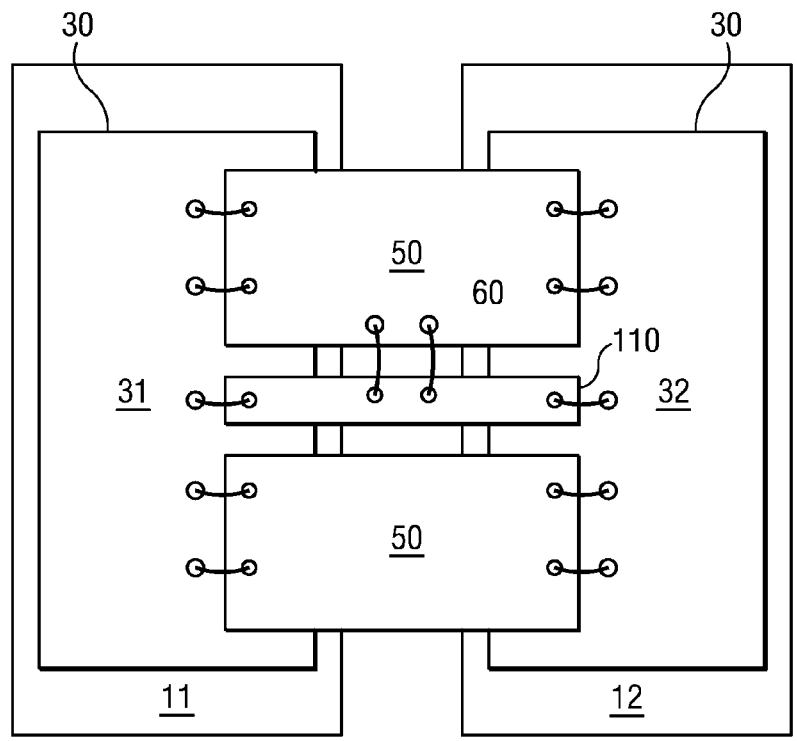

FIG. 13, which includes FIGS. 13a and 13b, illustrates an embodiment, wherein chips of different sizes are efficiently packaged in the semiconductor package.

Referring to FIG. 13a, first dies 30 (first chip 31 and second chip 32) are disposed over two die attach pads 11/12. Second dies 50 are disposed over the first dies 30. A third die 110 is disposed over the second die 50 such that the third die 110 is supported by the second dies 50.

In various embodiments, the package may require that the third die 110 is coupled to each of the first and the second dies 30 and 50, e.g., through bond wires 60. Alternately, in some embodiments, the third die 110 is coupled only to each of the first or the second dies 30 or 50.

As illustrated in FIG. 13b, in an alternative embodiment, a third die 110 is disposed at a same level as the second die 50 such that the third die 110 is supported by the first dies 30.

The embodiment described in FIG. 13 may be advantageous when the first dies are much larger than the second and the third dies 50 and 110. Alternatively, in some embodiments, the second and third dies 50 and 110 may be disposed on a same level above the first dies 30.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
    a substrate comprising a first and a second die attach pad;
    a first die disposed over the first die attach pad;
    a second die disposed over the second die attach pad, wherein the first die is disposed over a first portion of the first die attach pad and over a first portion of the second die attach pad; and
    a third die disposed between the first and the second die, a first portion of the third die disposed above a first portion of the first die, a second portion of the third die disposed above a first portion of the second die, and a third portion of the third die disposed above a first area between the first die and the second die.

2. The package of claim 1, further comprising:
    a fourth die disposed over the first die attach pad, wherein the fourth die is disposed between the first die and the first die attach pad; and
    a fifth die disposed over the second die attach pad, wherein the fifth die is disposed between the second die and the second die attach pad.

3. The package of claim 1, wherein the second die is disposed over a second portion of the second die attach pad and over a first portion of a third die attach pad.

4. The package of claim 1, wherein the first die is coupled to first contact leads on the substrate via first connectors, wherein the second die is coupled to second contact leads on the substrate via second connectors, and wherein the third die is coupled to third contact leads on the substrate via bond wires.

5. The package of claim 1, wherein a first plurality of bond wires couple the third die with the first die, and wherein a second plurality of bond wires couple the third die with the second die.

6. The package of claim 1, wherein the substrate is a leadframe.

7. The package of claim 1, wherein the substrate is a dual flat non-lead leadframe.

8. The package of claim 1, wherein the substrate, the first, the second, and the third dies are encapsulated with a molding material.

9. The package of claim 1, further comprising:
a fourth die disposed over the first die attach pad; and
a fifth die disposed over the second die attach pad.

10. A semiconductor package comprising:
a substrate comprising a first die attach pad and a second die attach pad;
a first die disposed over the first die attach pad, wherein the first die is disposed over a first portion of the first die attach pad and over a first portion of the second die attach pad;
a second die disposed over the second die attach pad;
a third die disposed between the first and the second die, a first portion of the third die disposed above a first portion of the first die, a second portion of the third die disposed above a first portion of the second die, and a third portion of the third die disposed above a first area between the first die and the second die;
a fourth die disposed over the first die attach pad, the fourth die disposed vertically between the first die attach pad and the first die and vertically between the first die attach pad and the second die; and
a fifth die disposed over the second die attach pad, the fifth die disposed vertically between the second die attach pad and the second die and vertically between the second die attach pad and the first die.

11. The package of claim 10, wherein the second die is disposed over a second portion of the second die attach pad and over a second portion of the first die attach pad.

12. The package of claim 10, wherein the fourth die is coupled to contact leads on the substrate via connectors, and wherein the fifth die is coupled to contact leads on the substrate via connectors.

13. The package of claim 10, wherein a first plurality of bond wires couples the third die with the first die, wherein a second plurality of bond wires couples the third die with the second die, wherein a third plurality of bonds wire couples the third die with the fourth die, and wherein a fourth plurality of bond wires couples the third die with the fifth die.

14. A semiconductor package comprising:
a substrate comprising a first and a second die attach pad;
a first die disposed over the first die attach pad;
a second die disposed over the second die attach pad, wherein the first die is disposed over a first portion of the first die attach pad and over a first portion of the second die attach pad;
a third die disposed between the first and the second die, a first portion of the third die disposed above a first portion of the first die, a second portion of the third die disposed above a first portion of the second die, and a third portion of the third die disposed above a first area between the first die and the second die;
a fourth die disposed over the first die attach pad;
a first contact lead coupling the first die to the third die; and
a second contact lead coupling the fourth die to the third die, wherein the first contact lead is oriented differently relative to the second contact lead.

15. The package of claim 14, wherein the second contact lead is disposed in a central region of a side of the fourth die.

16. The package of claim 14, further comprising:
a fifth die disposed over the second die attach pad.

* * * * *